(12) United States Patent
Watanabe et al.

(10) Patent No.: US 9,437,764 B2
(45) Date of Patent: Sep. 6, 2016

(54) PHOTOELECTRIC CONVERSION DEVICE AND METHOD FOR MANUFACTURING PHOTOELECTRIC CONVERSION DEVICE

(71) Applicant: CANON KABUSHIKI KAISHA, Tokyo (JP)

(72) Inventors: Takanori Watanabe, Yamato (JP); Takafumi Miki, Kawasaki (JP); Satoko Iida, Yokohama (JP); Masahiro Kobayashi, Tokyo (JP); Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/300,028

(22) Filed: Jun. 9, 2014

(65) Prior Publication Data

US 2014/0367747 A1    Dec. 18, 2014

(30) Foreign Application Priority Data

Jun. 13, 2013 (JP) ................................. 2013-124592

(51) Int. Cl.

| H01L 31/0352 | (2006.01) |
|---|---|
| H01L 27/146 | (2006.01) |
| H01L 27/148 | (2006.01) |
| H01L 31/18 | (2006.01) |

(52) U.S. Cl.
CPC ..... *H01L 31/03529* (2013.01); *H01L 27/1461* (2013.01); *H01L 27/14607* (2013.01); *H01L 27/14689* (2013.01); *H01L 27/14806* (2013.01); *H01L 31/186* (2013.01); *H01L 27/14643* (2013.01)

(58) Field of Classification Search
CPC .................................. H01L 27/146–27/14893
See application file for complete search history.

(56) References Cited

U.S. PATENT DOCUMENTS

| 2010/0002108 | A1* | 1/2010 | Mabuchi | H01L 27/14603 348/294 |
|---|---|---|---|---|
| 2010/0243864 | A1* | 9/2010 | Itonaga | H01L 27/14609 250/208.1 |
| 2013/0015513 | A1* | 1/2013 | Kido | H01L 27/1461 257/292 |
| 2013/0049081 | A1* | 2/2013 | Moriya | H01L 27/1461 257/291 |

FOREIGN PATENT DOCUMENTS

| CN | 101621067 A | 1/2010 |
|---|---|---|
| CN | 101853867 A | 10/2010 |
| JP | 2000-012828 A | 1/2000 |
| JP | 2000-031451 A | 1/2000 |
| JP | 2000-091550 A | 3/2000 |

(Continued)

*Primary Examiner* — Eric Ward
(74) *Attorney, Agent, or Firm* — Canon USA, Inc IP Division

(57) ABSTRACT

An exemplary embodiment is a photoelectric conversion device having a photoelectric conversion portion, and a transfer portion. The transfer portion transfers charges of the photoelectric conversion portion. The photoelectric conversion portion includes first and second semiconductor regions of a first conductivity type. Charges generated by photoelectric conversion are accumulated in the first and second semiconductor regions. According to the structure of the first and second semiconductor regions of the exemplary embodiment or the method for manufacturing them, the transfer efficiency of charges can be improved while improving the sensitivity of the photoelectric conversion portion.

14 Claims, 7 Drawing Sheets

(56) References Cited

FOREIGN PATENT DOCUMENTS

| JP | 2000-150857 A | 5/2000 |
| JP | 2002-164529 A | 6/2002 |
| JP | 2005-167187 A | 6/2005 |
| JP | 2008-047896 A | 2/2008 |
| JP | 2011-108824 A | 6/2011 |
| JP | 2011-146747 A | 7/2011 |

* cited by examiner

PHOTOELECTRIC CONVERSION DEVICE AND METHOD FOR MANUFACTURING PHOTOELECTRIC CONVERSION DEVICE

BACKGROUND OF THE INVENTION

1. Field of the Invention

The present invention relates to a photoelectric conversion device and a method for manufacturing a photoelectric conversion device.

2. Description of the Related Art

Japanese Patent Laid-Open No. 2005-167187 (hereinafter referred to as PTL 1) discloses an imaging device having a plurality of sensor cells. Each sensor cell has a photodiode including an accumulation well and a deep charge collection diffusion region. The accumulation well is relatively shallow in the depth direction of the substrate and is relatively wide in the horizontal direction. The deep charge collection diffusion region is located roughly in the center of the accumulation well. The deep charge collection diffusion region reaches an appropriately deep position in the depth direction, and is formed only in a relatively narrow region with respect to the horizontal direction. According to such a configuration, the collection efficiency of charges can be prevented from decreasing.

According to PTL 1, in the step of ion implantation for forming the accumulation well and in the step of ion implantation for forming the deep charge collection diffusion region, impurities of the same conductivity type are implanted into the same region. Specifically, in FIG. 4 (D) of PTL 1, it is disclosed to form the deep charge collection diffusion region (31 of FIG. 4 of PTL 1) by ion implantation. The distribution of boron ions implanted by this ion implantation has a peak at a depth of about 0.2 micrometers. In FIG. 5 (C) of PTL 1, it is disclosed to form an accumulation well (4 of FIG. 5 of PTL 1) by ion implantation. The distribution of boron ions implanted by this ion implantation has a peak at a depth of about 0.2 micrometers. Thus, impurities of the same conductivity type are implanted such that peaks of concentration distribution are located at the same depth. Two masks (31a of FIG. 4 of PTL 1, and 4a of FIG. 5 of PTL 1) used in the two steps of ion implantation have openings in the same region.

SUMMARY OF THE INVENTION

In an aspect of the present invention, a photoelectric conversion device includes a semiconductor substrate, a photoelectric conversion portion including first and second semiconductor regions of a first conductivity type disposed in the semiconductor substrate, and a transfer portion configured to transfer charges of the first and second semiconductor regions. The first semiconductor region extends along a first direction parallel to a surface of the semiconductor substrate. The first semiconductor region includes a part having a lower impurity concentration than that of a different part of the first semiconductor region. The second semiconductor region is disposed under the part having the lower impurity concentration. A length of the first semiconductor region along the first direction is greater than a length of the second semiconductor region along the first direction.

In another aspect of the present invention, a photoelectric conversion device includes a semiconductor substrate, a photoelectric conversion portion including first and second semiconductor regions of a first conductivity type disposed in the semiconductor substrate, a transfer portion configured to transfer charges of the first and second semiconductor regions, a third semiconductor region of a second conductivity type disposed over the first semiconductor region, and a fourth semiconductor region of the second conductivity type. The first semiconductor region includes a first part and a second part different from the first part. The first part, the second part, and the fourth semiconductor region are disposed at the same depth. The first part, the fourth semiconductor region, and the second part are arranged in this order along a first direction parallel to a surface of the semiconductor substrate. The second semiconductor region is disposed under the fourth semiconductor region. A length of the first semiconductor region along the first direction is greater than a length of the second semiconductor region along the first direction.

In another aspect of the present invention, provided is a method for manufacturing a photoelectric conversion device including a semiconductor substrate, a photoelectric conversion portion including first and second semiconductor regions of a first conductivity type, a transfer portion configured to transfer charges of the first and second semiconductor regions, and a third semiconductor region of a second conductivity type disposed over the first semiconductor region. The method includes a step of ion-implanting a first impurity of the first conductivity type into the semiconductor substrate using a first mask having a first opening to form the first semiconductor region. The method includes a step of ion-implanting a second impurity of the first conductivity type into the semiconductor substrate using a second mask having a second opening to form the second semiconductor region. The method includes a step of ion-implanting a third impurity of the second conductivity type into the semiconductor substrate using a third mask having a third opening to form the third semiconductor region. The method further includes a step of ion-implanting a fourth impurity of the second conductivity type into the semiconductor substrate using a fourth mask having a fourth opening. An orthogonal projection of the first opening onto a plane parallel to the surface of the semiconductor substrate encompasses an orthogonal projection of the second opening onto the plane and an orthogonal projection of the fourth opening onto the plane. The orthogonal projection of the second opening onto the plane and the orthogonal projection of the fourth opening onto the plane overlap at least partially with each other. A shape of the third opening and a shape of the fourth opening are different from each other. The second impurity is implanted into a position deeper than a region into which the first impurity is implanted. The fourth impurity is implanted into at least a part of the region into which the first impurity is implanted.

In another aspect of the present invention, provided is a method for manufacturing a photoelectric conversion device including a semiconductor substrate, a photoelectric conversion portion including first and second semiconductor regions of a first conductivity type, and a transfer portion configured to transfer charges of the first and second semiconductor regions. The method includes a step of ion-implanting a first impurity of the first conductivity type into the semiconductor substrate using a first mask having a first opening to form the first semiconductor region. The method includes a step of ion-implanting a second impurity of the first conductivity type into the semiconductor substrate using a second mask having a second opening to form the second semiconductor region. An orthogonal projection of the first opening onto a plane parallel to a surface of the semiconductor substrate encompasses an orthogonal projection of the second opening onto the plane. A peak of impurity concentration distribution of the second impurity is at a position deeper than a peak of impurity concentration distribution of the first impurity.

In another aspect of the present invention, provided is a method for manufacturing a photoelectric conversion device including a semiconductor substrate, a photoelectric conversion portion including first and second semiconductor regions of a first conductivity type, and a transfer portion configured to transfer charges of the first and second semiconductor regions. The method includes a step of ion-implanting a first impurity of the first conductivity type into the semiconductor substrate using a first mask having a first opening to form the first semiconductor region. The method includes a step of ion-implanting a second impurity of the first conductivity type into the semiconductor substrate using a second mask having a second opening to form the second semiconductor region. The first mask includes a first mask portion and a second mask portion that are separated from each other by the first opening. An orthogonal projection of the first opening onto a plane parallel to a surface of the semiconductor substrate surrounds an orthogonal projection of the first mask portion onto the plane. The orthogonal projection of the first mask portion onto the plane and an orthogonal projection of the second opening onto the plane overlap at least partially with each other. The second impurity is implanted into a position deeper than a region into which the first impurity is implanted.

In another aspect of the present invention, provided is a method for manufacturing a photoelectric conversion device including a semiconductor substrate. The method includes a step of forming a photoelectric conversion portion including a first semiconductor region of a first conductivity type that extends along a first direction parallel to a surface of the semiconductor substrate and a second semiconductor region that is disposed at a position deeper than the first semiconductor region. A length of the second semiconductor region along the first direction is less than a length of the first semiconductor region along the first direction. The method includes a step of forming a third semiconductor region of a second conductivity type disposed over the first semiconductor region. The method includes a step of forming a transfer portion configured to transfer charges of the first and second semiconductor regions. The method further includes any one of a step of decreasing concentration of the first conductivity type of a region and a step of making the region the second conductivity type. The region is positioned at the same depth as the first semiconductor region and over the second semiconductor region.

Further features of the present invention will become apparent from the following description of exemplary embodiments with reference to the attached drawings.

DESCRIPTION OF THE EMBODIMENTS

Figure 1A:
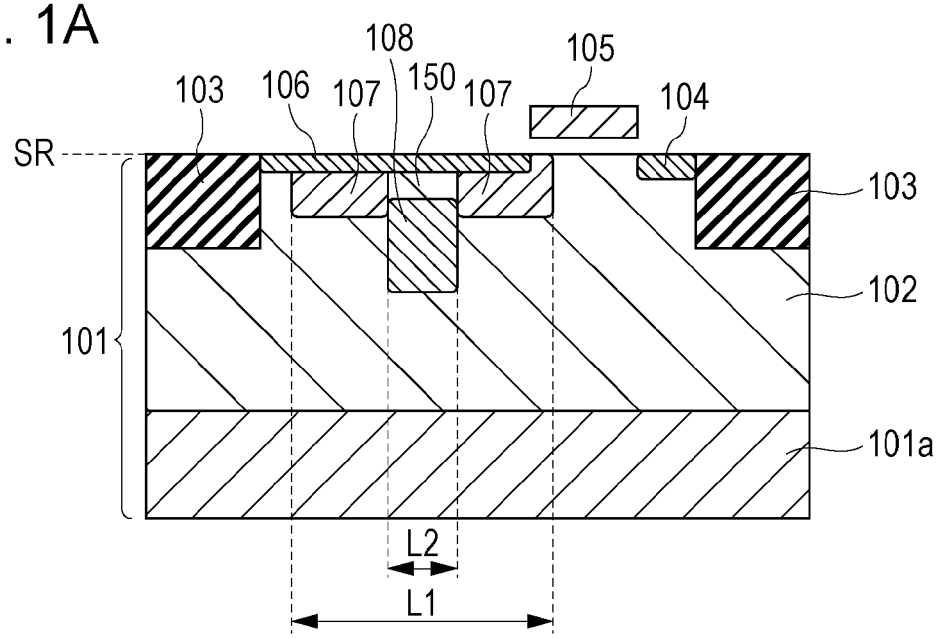
FIGS. 1A to 1C schematically show the section structure of a photoelectric conversion device, and patterns of masks used in manufacturing the photoelectric conversion device.

The inventors disclose a technique capable of improving the transfer efficiency of charges.

In the imaging device known to the inventors, an overlapping region, where the accumulation well and the deep charge collection diffusion region overlap with each other, has a high impurity concentration. For this reason, the overlapping region has a low potential for charges. Therefore, when transferring charges, a potential pocket tends to be formed in the overlapping region, and some of the charges may be left without being transferred. If some of the charges are left without being transferred, the maximum number of transferable charges may be limited. In another case, if some of the charges are left without being transferred, it may take a long time to transfer charges. That is, the transfer efficiency of charges may decrease.

Some embodiments according to the present invention provide a photoelectric conversion device having a photoelectric conversion portion and a transfer portion for transferring charges of the photoelectric conversion portion. Some embodiments according to the present invention provide a photoelectric conversion device having a plurality of pixels, such as CCD image sensors or CMOS image sensors. Each pixel includes a photoelectric conversion portion, and a transfer portion for transferring charges of the photoelectric conversion portion.

The photoelectric conversion portion includes a first semiconductor region of a first conductivity type and a second semiconductor region of the first conductivity type. Charges generated by photoelectric conversion are accumulated in the first and second semiconductor regions. In exemplary embodiments according to the present invention, by devising the structure of the first and second semiconductor regions or the method for manufacturing them, the transfer efficiency of charges can be improved while improving the sensitivity of the photoelectric conversion portion.

Exemplary embodiments according to the present invention will be described with reference to the drawings below. In the following exemplary embodiments, signal charges are electrons. Therefore, a first conductivity type is N-type, and a second conductivity type is P-type. In some exemplary embodiments, signal charges may be holes. When signal charges are holes, a first conductivity type is P-type, and a second conductivity type is N-type.

In this specification, the impurity of the first conductivity type is a main impurity contained in a semiconductor region of the first conductivity type. When the first conductivity type is N-type, the impurity of the first conductivity type is a donor, such as Phosphorus or Arsenic. The impurity of the second conductivity type is a main impurity contained in a semiconductor region of the second conductivity type. When the second conductivity type is P-type, the impurity of the second conductivity type is an acceptor, such as Boron.

In this specification, when referring to the positional relationship between two semiconductor regions in relation to the distance from a surface of the semiconductor substrate along a direction perpendicular to the surface, the term "deep" or "shallow" is used. When implying that the orthogonal projections of two semiconductor regions onto a plane parallel to the surface of the semiconductor substrate overlap with each other, the term "over" or "under" is used. That is, the wording "the first semiconductor region is located over the second semiconductor region" means that the first semiconductor region is located at a position shallower than the second semiconductor region, and the orthogonal projections of the first and second semiconductor regions onto a plane parallel to the surface of the semiconductor substrate overlap each other. A position closer to the surface of the semiconductor substrate on which light is incident will be referred to as "shallow" or "over." The surface of the semiconductor substrate on which light is incident is the interface between the semiconductor substrate and an insulator disposed thereon in a position in which the photoelectric conversion portion is disposed.

First Exemplary Embodiment

A photoelectric conversion device of a first exemplary embodiment will be described. FIG. 1A schematically shows the section structure of the photoelectric conversion device. The photoelectric conversion device has a semiconductor substrate 101. The semiconductor substrate 101 is, for example, an N-type silicon substrate. The semiconductor substrate 101 is formed by epitaxial growth. Semiconductor regions for forming a photoelectric conversion portion, a transistor, and the like are formed in the semiconductor substrate 101. No semiconductor regions are formed in a part 101a of the semiconductor substrate 101.

In the semiconductor substrate 101, a well region 102, an element isolation portion 103, a floating diffusion portion (hereinafter referred to as FD portion) 104, a surface region 106, first and second accumulation regions 107 and 108, and a P-type semiconductor region 150 are disposed.

The well region 102 is a P-type semiconductor region. The element isolation portion 103 is formed of an insulator. For example, the element isolation portion 103 is a shallow trench isolation (STI) portion. The FD portion 104 is a N-type semiconductor region. The FD portion 104 forms an input node of an amplifying portion (not shown). A transfer gate electrode 105 is disposed on the semiconductor substrate 101 with an insulation film (not shown) therebetween. The transfer gate electrode 105 is formed, for example, of polysilicon. The transfer gate electrode 105 transfers charges of the photoelectric conversion portion to the FD portion 104. That is, the transfer gate electrode 105 forms a transfer portion. Instead of the FD portion 104, an overflow drain or a channel portion of a CCD may be disposed. The transfer portion can transfer charges in order to discharge charges.

The photoelectric conversion portion is, for example, a photodiode. Specifically, in this exemplary embodiment, the photoelectric conversion portion includes a first accumulation region 107 and a second accumulation region 108. The first and second accumulation regions 107 and 108 are both N-type semiconductor regions. The first and second accumulation regions 107 and 108 form PN junction with a P-type semiconductor region such as the well region 102. Charges generated by photoelectric conversion are drifted to the first and second accumulation regions 107 and 108 by the electric field in the depletion layer of the PN junctions formed with the well region 102.

The transfer portion transfers charges accumulated in either one of the first and second accumulation regions 107 and 108. The transfer portion may transfer charges such that the entire first and second accumulation regions 107 and 108 may be depleted. That is, the transfer portion may carry out complete depletion transfer.

The surface region 106 is disposed over the first accumulation region 107. The surface region 106 is a P-type semiconductor region. The surface region 106 prevents dark current generated on the surface SR of the semiconductor substrate from entering the first accumulation region 107. A part of the first accumulation region 107 may be disposed at the same depth as the surface region 106. For example, in this exemplary embodiment, in order to improve the transfer efficiency, the first accumulation region 107 extends to a position under the transfer gate electrode 105. A part of the first accumulation region 107 that is disposed under the transfer gate electrode 105 is disposed at the same depth as the surface region 106. The surface region 106 may be omitted, and the first accumulation region 107 may extend to the surface SR of the semiconductor substrate.

The P-type semiconductor region 150 is disposed under a part of the surface region 106. The impurity concentration of the P-type semiconductor region 150 may be substantially the same as the impurity concentration of the well region 102. The impurity concentration of the P-type semiconductor region 150 may be an intermediate value between the impurity concentration of the surface region 106 and the impurity concentration of the well region 102 owing to the diffusion of impurity from the surface region 106.

The first accumulation region 107 includes a first part and a second part. In FIG. 1A, of the two regions denoted by reference numeral 107, the left-hand region schematically shows the section of the first part, and the right-hand region schematically shows the section of the second part. As shown in FIG. 1A, the first part of the first accumulation region 107, the P-type semiconductor region 150, and the second part of the first accumulation region 107 are arranged along a first direction parallel to the surface SR of the semiconductor substrate 101.

The second accumulation region 108 is disposed under the P-type semiconductor region 150. At least a part of the second accumulation region 108 is disposed at a position deeper than the first accumulation region 107. The entire second accumulation region 108 may be disposed at a position deeper than the first accumulation region 107.

In this exemplary embodiment, the first accumulation region 107 and the second accumulation region 108 are N-type semiconductor regions continuous with each other. However, a P-type semiconductor region may be interposed between the first accumulation region 107 and the second accumulation region 108. When the entire first and second accumulation regions 107 and 108 are depleted, the P-type semiconductor region between the first and second accumulation regions 107 and 108 can be depleted. Owing to such a configuration, the first and second accumulation regions 107 and 108 are electrically connected with each other.

In FIG. 1A, the length of the first accumulation region 107 along the first direction is shown by arrow L1. The length of the second accumulation region 108 along the first direction is shown by arrow L2. The length L1 of the first accumulation region 107 along the first direction is greater than the length L2 of the second accumulation region 108 along the first direction.

In the section shown in FIG. 1A, the first part and the second part of the first accumulation region 107 are separated. In fact, however, the first accumulation region 107 is continuous on the far side or near side of the paper plane.

According to such a configuration, the overlapping region, where the first accumulation region 107 and the second accumulation region 108 overlap with each other, can be reduced. Alternatively, the first accumulation region 107 and the second accumulation region 108 do not overlap at all. That is, in the photoelectric conversion portion, the region having a high N-type impurity concentration can be reduced. Therefore, when transferring charges of the photoelectric conversion portion, a potential pocket is hardly formed. As a result, the transfer efficiency can be improved.

When a part of the first accumulation region 107 is disposed over the second accumulation region 108, a depletion layer from below hardly reaches the part. Therefore, by the fact that the P-type semiconductor region 150 is disposed over the second accumulation region 108, the first accumulation region 107 and the second accumulation region 108 can be depleted easily. In other words, the entire first and second accumulation regions 107 and 108 can be depleted at a lower voltage. Therefore, charges can be transferred at a lower voltage.

The length L1 of the first accumulation region 107 along the first direction is greater than the length L2 of the second accumulation region 108 along the first direction. That is, the second accumulation region 108, which is narrower than the first accumulation region 107, extends in the depth direction of the substrate. For this reason, the saturation charge quantity and the sensitivity can be improved while maintaining the transfer efficiency.

Next, a method for manufacturing a photoelectric conversion device of this exemplary embodiment, and a mask used therein will be described. The first accumulation region 107 and the second accumulation region 108 are each formed by a method including the step of ion-implanting an N-type impurity into the semiconductor substrate. By using different masks in the two ion implantation operations, the region into which the impurity is implanted in both of the two ion implantation operations, that is, the overlapping region between the first and second accumulation regions 107 and 108 can be reduced.

Figure 1B:
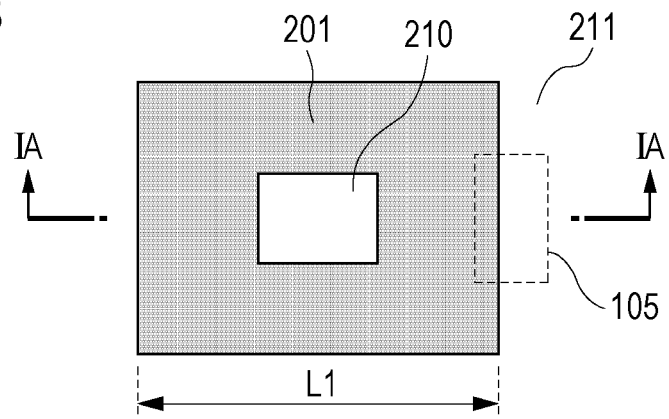
Figure 1C:
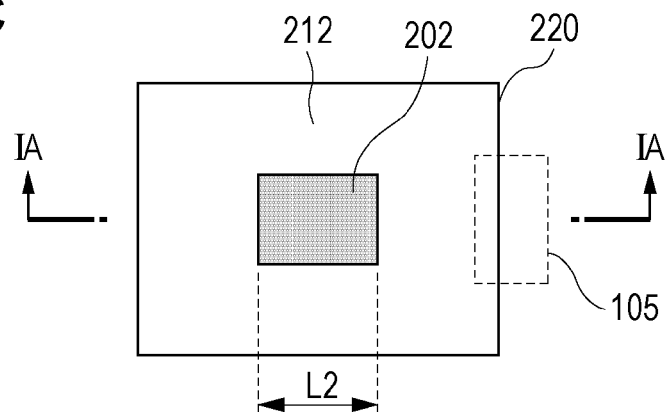

FIGS. 1B and 1C schematically show the patterns of masks used in each ion implantation process. FIGS. 1B and 1C show the orthogonal projections of the patterns of masks onto a plane parallel to the surface SR of the semiconductor substrate. When designing a mask using CAD, usually, the orthogonal projection of the pattern of mask onto a plane parallel to the surface SR of the semiconductor substrate is equivalent to a CAD drawing displayed on a display or paper. Of course, a CAD drawing is a design drawing, and therefore there may be a manufacturing error between an actual pattern of mask and a CAD drawing.

A first mask used for forming the first accumulation region 107 is schematically shown in FIG. 1B. In FIG. 1B, the position of the transfer gate electrode 105 is shown by dashed line. The section taken along line IA-IA of FIG. 1B corresponds to the section schematically shown in FIG. 1A.

The first mask has an opening 201. The first mask includes a first mask portion 210 and a second mask portion 211. In ion implantation for forming the first accumulation region 107, the impurity is implanted through the opening 201 into the semiconductor substrate. The impurity is not implanted into the region in which the first mask portion 210 or the second mask portion 211 is disposed. Therefore, the first accumulation region 107 is formed at a position corresponding to the opening 201. That is, the opening 201 of FIG. 1B shows the planar layout of the first accumulation region 107. However, because of the inclination angle of ion implantation, scattering in the semiconductor substrate, and the like, the orthogonal projection of the first accumulation region 107 onto a plane parallel to the surface SR of the semiconductor substrate does not have to exactly coincide with the orthogonal projection of the opening 201 onto the plane.

The transfer gate electrode 105 may be formed before forming the first accumulation region 107. In this case, ion implantation for forming the first accumulation region 107 is carried out with at least a part of the transfer gate electrode 105 exposed from the opening 201.

A second mask used for forming the second accumulation region 108 is schematically shown in FIG. 1C. In FIG. 1C, the position of the transfer gate electrode 105 is shown by dashed line. The section taken along line IA-IA of FIG. 1C corresponds to the section schematically shown in FIG. 1A.

The second mask has an opening 202. The second mask includes a mask portion 212. In ion implantation for forming the second accumulation region 108, the impurity is implanted through the opening 202 into the semiconductor substrate. The impurity is not implanted into the region in which the mask portion 212 is disposed. Therefore, the second accumulation region 108 is formed at a position corresponding to the opening 202. That is, the opening 202 of FIG. 1C shows the planar layout of the second accumulation region 108. However, because of the inclination angle of ion implantation, scattering in the semiconductor substrate, and the like, the orthogonal projection of the second accumulation region 108 onto a plane parallel to the surface SR of the semiconductor substrate does not have to exactly coincide with the orthogonal projection of the opening 202 onto the plane.

In ion implantation for forming the second accumulation region 108, the impurity is implanted into a position deeper than the region into which the impurity is implanted by ion implantation for forming the first accumulation region 107. In general, by carrying out ion implantation at higher energy, an impurity can be implanted into a deeper position. So, in this exemplary embodiment, the energy of ion implantation for forming the second accumulation region 108 is higher than the energy of ion implantation for forming the first accumulation region 107. However, the penetration depth of impurity can vary according to the valence of ion and ionic species.

Due to channeling or the like, the region into which the impurity is implanted by ion implantation may be wide. In such a case, the region into which the impurity is implanted by ion implantation may be defined as, for example, a region of the half-value width of the impurity concentration at the peak of the impurity concentration distribution. Alternatively, the region into which the impurity is implanted by ion implantation may be defined as a region having at least an impurity concentration that is an order of magnitude lower than the impurity concentration at the peak of the impurity concentration distribution.

Here, in FIG. 1C, the outer edge of the opening 201 of the first mask is shown by solid line 220. As shown in FIG. 1C, the orthogonal projection of the opening 202 of the second mask onto a plane parallel to the surface SR of the semiconductor substrate is surrounded by the outer edge of the opening 201 of the first mask. That is, the orthogonal projection of the opening 201 of the first mask onto a plane parallel to the surface SR of the semiconductor substrate encompasses the orthogonal projection of the opening 202 of the second mask onto a plane parallel to the surface SR of the semiconductor substrate.

Since the opening of the first mask and the opening of the second mask have such a relationship, the length L1 of the first accumulation region 107 along the first direction can be made longer than the length L2 of the second accumulation region 108 along the first direction.

When designing mask patterns using CAD, the positional relationship between two masks can be confirmed by superimposing the design drawings of the two masks on a CAD drawing.

In an aspect of this exemplary embodiment, the peak of the impurity concentration distribution formed by ion implantation for forming the second accumulation region 108 is at a position deeper than the peak of the impurity concentration distribution formed by ion implantation for forming the first accumulation region 107. When a plurality of peaks are formed by ion implantation for forming the second accumulation region 108, all of them are at positions deeper than the peak of the impurity concentration distribution formed by ion implantation for forming the first accumulation region 107.

According to such a configuration, the overlapping region between the first accumulation region 107 and the second accumulation region 108 can be reduced. Alternatively, the first accumulation region 107 and the second accumulation region 108 do not overlap at all. That is, in the photoelectric conversion portion, the region having a high N-type impurity concentration can be reduced. Therefore, when transferring charges of the photoelectric conversion portion, a potential pocket is hardly formed. As a result, the transfer efficiency can be improved.

Another aspect of this exemplary embodiment will be described. The first mask shown in FIG. 1B includes the first mask portion 210 and the second mask portion 211 that are separated from each other by the opening 201. In the first mask, the opening 201 is formed so as to surround the first mask portion 210. The impurity is not implanted into the region under the first mask portion 210 of the first mask. For this reason, the N-type impurity concentration of the region is hardly higher than that before forming the first accumulation region 107.

Here, the orthogonal projection of the first mask portion 210 onto a plane parallel to the surface SR of the semiconductor substrate and the orthogonal projection of the opening 202 of the second mask shown in FIG. 1C onto the plane coincide with each other. That is, the first accumulation region 107 can be formed such that the impurity concentration of the region into which the N-type impurity is implanted in ion implantation for forming the second accumulation region 108 (the region corresponding to the opening 202) hardly increases.

According to such a configuration, the overlapping region between the first accumulation region 107 and the second accumulation region 108 can be reduced. Alternatively, the first accumulation region 107 and the second accumulation region 108 do not overlap at all. That is, in the photoelectric conversion portion, the region having a high N-type impurity concentration can be reduced. Therefore, when transferring charges of the photoelectric conversion portion, a potential pocket is hardly formed. As a result, the transfer efficiency can be improved.

In this exemplary embodiment, the orthogonal projection of the first mask portion 210 onto a plane parallel to the surface SR of the semiconductor substrate and the orthogonal projection of the opening 202 of the second mask onto the plane coincide with each other. However, as long as the orthogonal projection of the first mask portion 210 and the orthogonal projection of the opening 202 of the second mask overlap at least partially, the above-described advantageous effect of improving transfer efficiency can be obtained.

Next, modifications of the manufacturing method using the masks shown in FIGS. 1B and 1C will be described. In some modifications, in ion implantation for forming the first accumulation region 107 and ion implantation for forming the second accumulation region 108, the impurity may be implanted into the same depth.

Figure 2:
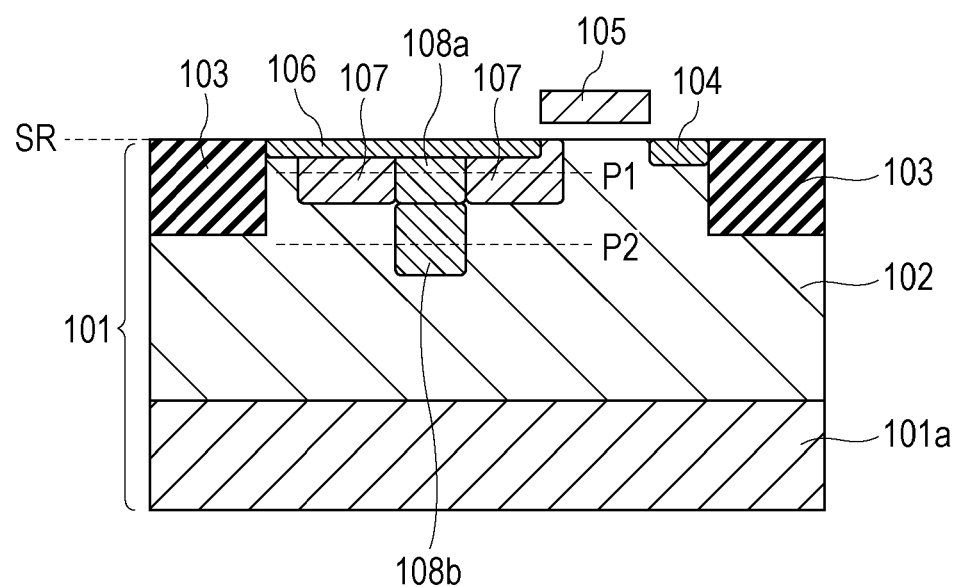
FIG. 2 schematically shows the section structure of a photoelectric conversion device.

FIG. 2 schematically shows the section structure of a photoelectric conversion device. The second accumulation region 108 includes a first part 108a and a second part 108b. The different parts are the same as those in FIG. 1A. The first part 108a and the second part 108b are formed by carrying out two ion implantation operations that are different in energy using the mask shown in FIG. 1C.

As shown in FIG. 2, the first part 108a of the second accumulation region 108 is disposed at the same depth as the first accumulation region 107. Specifically, the peak of impurity concentration distribution formed in ion implantation for forming the first accumulation region 107 and the peak of impurity concentration distribution formed in ion implantation for forming the first part 108a of the second accumulation region 108 are located at the same depth P1. The peak of impurity concentration distribution formed in ion implantation for forming the second part 108b of the second accumulation region 108 is located at a depth P2. The second part 108b is formed at a position deeper than the first accumulation region 107.

Also in such a configuration, the advantageous effect of improving transfer efficiency can be obtained by the fact that the orthogonal projection of the first mask portion 210 of the first mask onto a plane parallel to the surface SR of the semiconductor substrate and the orthogonal projection of the opening 202 of the second mask onto the plane coincide or overlap partially.

By forming a P-type semiconductor region, such as the well region 102, in the region of the first mask portion 210 before carrying out ion implantation for forming the first accumulation region 107, the P-type semiconductor region 150 can be formed simultaneously with forming the first accumulation region 107.

That is, by carrying out ion implantation using the first mask shown in FIG. 1B, the first part of the first accumulation region 107, the P-type semiconductor region 150, and the second part of the first accumulation region 107 arranged in the first direction can be formed easily.

According to such a configuration, the first accumulation region 107 and the second accumulation region 108 can be depleted easily. That is, the entire first and second accumulation regions 107 and 108 can be depleted at a lower voltage. Therefore, charges can be transferred at a lower voltage.

In this exemplary embodiment, the surface region 106 is formed by ion implantation using a third mask having an opening that is different in shape from the opening 202 of the second mask. The pattern of the third mask may be, for example, that shown in FIG. 1B or FIG. 3B. When the opening 202 of the second mask and the opening of the third mask are similar to each other but not congruent with each other, they are different in shape. Generally in the present specification, two objects which are similar to each other but not congruent with each other are referred to be different in shape. The surface region 106 can be formed using techniques known in the art.

Before forming the surface region 106, the transfer gate electrode 105 may be formed. In this case, ion implantation for forming the surface region 106 is carried out with at least a part of the transfer gate electrode 105 exposed from the opening of the third mask.

In this exemplary embodiment, the N-type impurity is a donor such as phosphorus or arsenic. In ion implantation for forming the first accumulation region and ion implantation for forming the second accumulation region 108, the same type of impurity may be used. Alternatively, different type of impurities may be used in them. For example, arsenic may be used for forming the first accumulation region 107, and phosphorus may be used for forming the second accumulation region 108.

In this exemplary embodiment, the P-type impurity is an acceptor such as boron. Boron is used in ion implantation for forming the surface region 106.

The masks of this exemplary embodiment are formed of photoresist. In this case, the masks are patterned using photolithography. Alternatively, the masks may be hard masks formed of an oxide film or a nitride film. In this case, the masks are patterned by etching.

A modification of this exemplary embodiment will be described. The distance from the center of gravity of the orthogonal projection of the second accumulation region 108 onto a plane parallel to the surface SR of the semiconductor substrate to the orthogonal projection of the transfer gate electrode 105 onto the plane will be referred to as first distance. The distance from the center of gravity of the orthogonal projection of the first accumulation region 107 onto the plane to the orthogonal projection of the transfer gate electrode 105 onto the plane will be referred to as second distance. Here, in the modification of this exemplary embodiment, the first distance may be less than the second distance. According to such a configuration, the second accumulation region 108 is disposed near the transfer gate electrode 105, and therefore the transfer efficiency can be further improved.

Second Exemplary Embodiment

Another exemplary embodiment will be described. This exemplary embodiment differs from the first exemplary embodiment in the structure of the first accumulation region, and the method for manufacturing it. So, only the differences from the first exemplary embodiment will be described, and the description of the same portions as those of the first exemplary embodiment will be omitted.

Figure 3A:
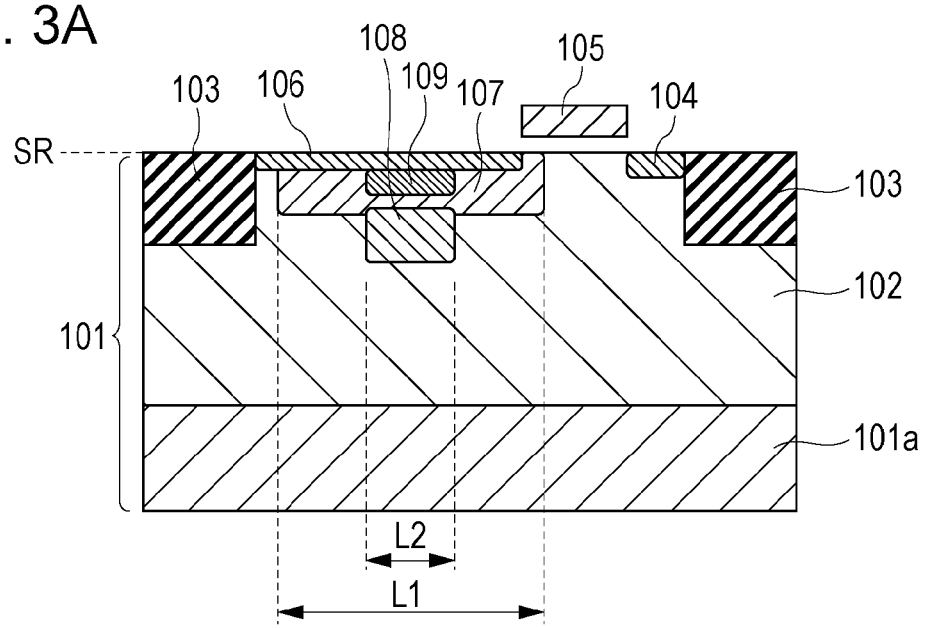
FIGS. 3A to 3C schematically show the section structure of a photoelectric conversion device, and patterns of masks used in manufacturing the photoelectric conversion device.

FIG. 3A schematically shows the section structure of a photoelectric conversion device. The same reference numerals are used to designate the same portions as those in FIG. 1A. Here, detailed description will be omitted.

In this exemplary embodiment, a first accumulation region includes a first part 109 and a second part 107 different from the first part 109. The first part 109 and the second part 107 are arranged in a direction along the surface SR of the semiconductor substrate. The impurity concentration of the first part 109 is lower than the impurity concentration of the second part 107. The second part 107 is the same as the first accumulation region 107 of the first exemplary embodiment.

In this exemplary embodiment, a second accumulation region 108 is disposed under the first part 109 of the first accumulation region. In other words, a part (first part 109) of the first accumulation region that is disposed over the second accumulation region 108 has a lower impurity concentration than that of a different part (second part 107) of the first accumulation region.

According to such a configuration, in the photoelectric conversion portion, the region having a high N-type impurity concentration can be reduced. Therefore, when transferring charges of the photoelectric conversion portion, a potential pocket is hardly formed. As a result, the transfer efficiency can be improved.

In this exemplary embodiment, the second part 107 of the first accumulation region and the second accumulation region 108 are N-type semiconductor regions continuous with each other. However, a P-type semiconductor region may be interposed between the second part 107 of the first accumulation region and the second accumulation region 108. When the entire first and second accumulation regions are depleted, the P-type semiconductor region interposed between the second part 107 and the second accumulation region 108 can be depleted. Owing to such a configuration, the first accumulation region and the second accumulation region 108 are electrically connected with each other.

The length L1 of the first accumulation region along the first direction is greater than the length L2 of the second accumulation region 108 along the first direction. That is, the second accumulation region 108, which is narrower than the first accumulation region, extends in the depth direction of the substrate. For this reason, the saturation charge quantity and the sensitivity can be improved while maintaining the transfer efficiency.

Next, a method for manufacturing a photoelectric conversion device of this exemplary embodiment, and a mask used therein will be described. The first accumulation region and the second accumulation region 108 are each formed by a method including the step of ion-implanting an N-type impurity into the semiconductor substrate. By the fact that the P-type impurity is ion-implanted into the first part 109 of the first accumulation region, the impurity concentration is adjusted.

Figure 3B:
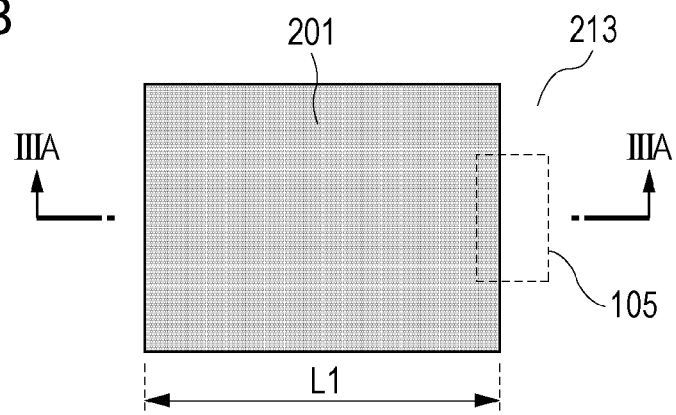
Figure 3C:
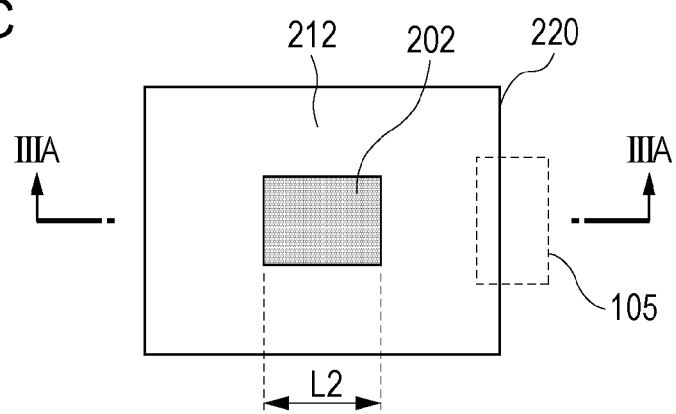

FIGS. 3B and 3C schematically show the patterns of masks used in each ion implantation process. FIGS. 3B and 3C show the orthogonal projections of the patterns of masks onto a plane parallel to the surface SR of the semiconductor substrate. When designing a mask using CAD, usually, the orthogonal projection of the pattern of mask onto a plane parallel to the surface SR of the semiconductor substrate is equivalent to a CAD drawing displayed on a display or paper. Of course, a CAD drawing is a design drawing, and therefore there may be a manufacturing error between an actual pattern of mask and a CAD drawing.

A first mask used for forming the first accumulation region is schematically shown in FIG. 3B. In FIG. 3B, the position of the transfer gate electrode 105 is shown by dashed line. The section taken along line IIIA-IIIA of FIG. 3B corresponds to the section schematically shown in FIG. 3A.

The first mask has an opening 201. The first mask includes a mask portion 213. In ion implantation for forming the first accumulation region, the impurity is implanted through the opening 201 into the semiconductor substrate. The impurity is not implanted into the region in which the mask portion 213 is disposed. Therefore, the first accumulation region is formed at a position corresponding to the opening 201. That is, the opening 201 of FIG. 3B shows the planar layout of the first accumulation region. However, because of the inclination angle of ion implantation, scattering in the semiconductor substrate, and the like, the orthogonal projection of the first accumulation region onto a plane parallel to the surface SR of the semiconductor substrate does not have to exactly coincide with the orthogonal projection of the opening 201 onto the plane.

The transfer gate electrode 105 may be formed before forming the first accumulation region. In this case, ion implantation for forming the first accumulation region is carried out with at least a part of the transfer gate electrode 105 exposed from the opening 201.

A second mask used for forming the second accumulation region 108 is schematically shown in FIG. 3C. In FIG. 3C, the position of the transfer gate electrode 105 is shown by dashed line. The section taken along line IIIA-IIIA of FIG. 3C corresponds to the section schematically shown in FIG. 3A.

The second mask has an opening 202. The second mask includes a mask portion 212. In ion implantation for forming the second accumulation region 108, the impurity is implanted through the opening 202 into the semiconductor substrate. The impurity is not implanted into the region in which the mask portion 212 is disposed. Therefore, the second accumulation region 108 is formed at a position corresponding to the opening 202. That is, the opening 202 of FIG. 3C shows the planar layout of the second accumulation region 108. However, because of the inclination angle of ion implantation, scattering in the semiconductor substrate, and the like, the orthogonal projection of the second accumulation region 108 onto a plane parallel to the surface SR of the semiconductor substrate does not have to exactly coincide with the orthogonal projection of the opening 202 onto the plane.

In ion implantation for forming the second accumulation region 108, the impurity is implanted into a position deeper than the region into which the impurity is implanted by ion implantation for forming the first accumulation region. In general, by carrying out ion implantation at higher energy, an impurity can be implanted into a deeper position. So, in this exemplary embodiment, the energy of ion implantation for forming the second accumulation region 108 is higher than the energy of ion implantation for forming the first accumulation region 107. However, even if the energy is the same, the penetration depth can vary according to the valence of ion and ionic species.

Here, in FIG. 3C, the outer edge of the opening 201 of the first mask is shown by solid line 220. As shown in FIG. 3C, the orthogonal projection of the opening 202 of the second mask onto a plane parallel to the surface SR of the semiconductor substrate is surrounded by the outer edge of the opening 201 of the first mask. That is, the orthogonal projection of the opening 201 of the first mask onto a plane parallel to the surface SR of the semiconductor substrate encompasses the orthogonal projection of the opening 202 of the second mask onto a plane parallel to the surface SR of the semiconductor substrate.

Since the opening of the first mask and the opening of the second mask have such a relationship, the length L1 of the first accumulation region along the first direction can be made longer than the length L2 of the second accumulation region 108 along the first direction.

When designing mask patterns using CAD, the positional relationship between two masks can be confirmed by superimposing the design drawings of the two masks on a CAD drawing.

In this exemplary embodiment, the surface region 106 is formed by ion implantation using a third mask having an opening that is different in shape from the second mask. The surface region 106 can be formed using techniques known in the art.

Before forming the surface region 106, the transfer gate electrode 105 may be formed. In this case, ion implantation for forming the surface region 106 is carried out with at least a part of the transfer gate electrode 105 exposed from the opening of the third mask.

FIG. 3C schematically shows the pattern of a fourth mask. Using the fourth mask, the P-type impurity is ion-implanted into the first part 109 of the first accumulation region. The fourth mask has an opening 202. The fourth mask includes a mask portion 212. In ion implantation of the P-type impurity, the impurity is implanted through the opening 202 into the semiconductor substrate. The impurity is not implanted into the region in which the mask portion 212 is disposed. Therefore, the first part 109 of the first accumulation region is formed at a position corresponding to the opening 202. That is, the opening 202 of FIG. 3C shows the planar layout of the first part 109 of the first accumulation region. However, because of the inclination angle of ion implantation, scattering in the semiconductor substrate, and the like, the orthogonal projection of the first part 109 of the first accumulation region onto a plane parallel to the surface SR of the semiconductor substrate does not have to exactly coincide with the orthogonal projection of the opening 202 onto the plane.

In ion implantation using the fourth mask, the P-type impurity is implanted into a position shallower than the second accumulation region 108. In general, by carrying out ion implantation at lower energy, an impurity can be implanted into a shallower position. So, in this exemplary embodiment, the energy of ion implantation using the fourth mask is lower than the energy of ion implantation for forming the second accumulation region 108. However, the penetration depth of impurity can vary according to the valence of ion and ionic species.

In FIG. 3C, the outer edge of the opening 201 of the first mask is shown by solid line 220. As shown in FIG. 3C, the orthogonal projection of the opening 202 of the fourth mask onto a plane parallel to the surface SR of the semiconductor substrate is surrounded by the outer edge of the opening 201 of the first mask. That is, the orthogonal projection of the opening 201 of the first mask onto a plane parallel to the surface SR of the semiconductor substrate encompasses the orthogonal projection of the opening 202 of the fourth mask onto a plane parallel to the surface SR of the semiconductor substrate.

In this exemplary embodiment, a common mask is used as the second mask and the fourth mask. That is, the orthogonal projection of the opening 202 of the second mask onto a plane parallel to the surface SR of the semiconductor substrate and the orthogonal projection of the opening 202 of the fourth mask onto the plane coincide with each other. The orthogonal projection of the opening of the second mask and the orthogonal projection of the opening of the fourth mask only have to overlap at least partially. In this case, the second mask and the fourth mask can be formed separately.

The opening of the first mask and the opening of the fourth mask have such a relationship. Therefore, by ion implantation using the fourth mask, the P-type impurity is implanted into a part of the first accumulation region that is disposed over the second accumulation region 108. The part into which the P-type impurity is implanted has a low N-type impurity concentration. Therefore, the first part 109 having an impurity concentration lower than that of the second part 107 can be formed.

According to such a configuration, in the photoelectric conversion portion, the region having a high N-type impurity concentration can be reduced. Therefore, when transferring charges of the photoelectric conversion portion, a potential pocket is hardly formed. As a result, the transfer efficiency can be improved.

In particular, a part of the first accumulation region that is disposed over the second accumulation region 108 tends to have a high impurity concentration. Therefore, the P-type impurity is ion-implanted into the part, and therefore, the advantageous effect of improving transfer efficiency is high.

In this exemplary embodiment, the mask shown in FIG. 1B may be used in ion implantation for forming the first accumulation region. In this case, the first mask includes the opening 201, and the first mask portion 210 and the second mask portion 211 separated by the opening 201. The orthogonal projection of the first mask portion 210 onto a plane parallel to the surface SR of the semiconductor substrate and the orthogonal projection of the opening 202 of the second mask onto the plane coincide or at least partially overlap.

According to such a configuration, the overlapping region between the first accumulation region 107 and the second accumulation region 108 can be reduced. Alternatively, the first accumulation region 107 and the second accumulation region 108 do not overlap at all. That is, in the photoelectric conversion portion, the region having a high N-type impurity concentration can be reduced. Therefore, when transferring charges of the photoelectric conversion portion, a potential pocket is hardly formed. As a result, the transfer efficiency can be further improved.

In ion implantation for forming the first accumulation region and ion implantation for forming the second accumulation region 108, the N-type impurity may be implanted into the same region. In this case, by the fact that the P-type impurity is implanted into the region by ion implantation using the fourth mask, the advantageous effect of improving transfer efficiency becomes more pronounced.

A photoelectric conversion device manufactured by the manufacturing method of this exemplary embodiment may have a P-type semiconductor region 150 instead of the first part 109 of the first accumulation region. By increasing the dose of ion implantation using the fourth mask, the P-type semiconductor region 150 is formed. The photoelectric conversion device in this case may have the structure shown in FIG. 1A.

In this exemplary embodiment, the N-type impurity is a donor such as phosphorus or arsenic. In ion implantation for forming the first accumulation region and ion implantation for forming the second accumulation region 108, the same type of impurity may be used. Alternatively, different type of impurities may be used in them. For example, arsenic may be used for forming the first accumulation region 107, and phosphorus may be used for forming the second accumulation region 108.

In this exemplary embodiment, the P-type impurity is an acceptor such as boron. Boron is used in ion implantation for forming the surface region 106. Boron is used in ion implantation using the fourth mask.

The masks of this exemplary embodiment are formed of photoresist. In this case, the masks are patterned using photolithography. Alternatively, the masks may be hard masks formed of an oxide film or a nitride film. In this case, the masks are patterned by etching.

A modification of this exemplary embodiment will be described. The distance from the center of gravity of the orthogonal projection of the second accumulation region 108 onto a plane parallel to the surface SR of the semiconductor substrate to the orthogonal projection of the transfer gate electrode 105 onto the plane will be referred to as first distance. The distance from the center of gravity of the orthogonal projection of the first accumulation region 107 onto the plane to the orthogonal projection of the transfer gate electrode 105 onto the plane will be referred to as second distance. Here, in the modification of this exemplary embodiment, the first distance may be less than the second distance. According to such a configuration, the second accumulation region 108 is disposed near the transfer gate electrode 105, and therefore the transfer efficiency can be further improved.

Third Exemplary Embodiment

Another exemplary embodiment will be described. This exemplary embodiment differs from the second exemplary embodiment in that ion implantation of the P-type impurity using the fourth mask is not carried out. So, only the differences from the second exemplary embodiment will be described, and the description of the same portions as those of the second exemplary embodiment will be omitted.

Figure 4:
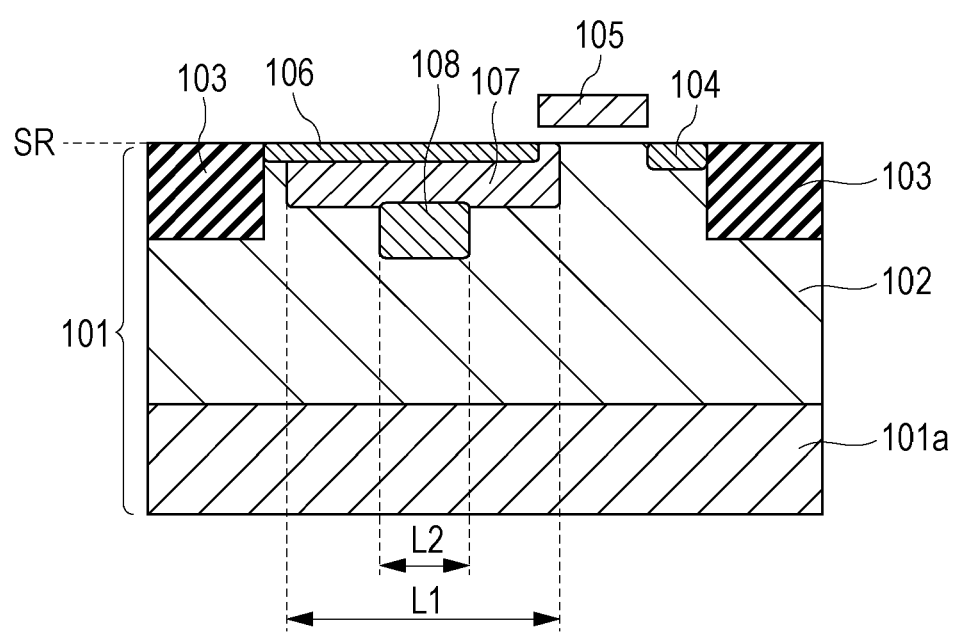
FIG. 4 schematically shows the section structure of a photoelectric conversion device.

FIG. 4 schematically shows the section structure of a photoelectric conversion device. In FIG. 4, the same reference numerals are used to designate the same portions as those in FIG. 1A, FIG. 2, or FIG. 3A. As shown in FIG. 4, the P-type semiconductor region 150 of the first exemplary embodiment is not disposed. Unlike in the second exemplary embodiment, the first accumulation region 107 does not include the first part 109 having a low impurity concentration. That is, the first accumulation region 107 has impurity concentration distribution that is substantially uniform along the first direction parallel to the surface SR of the semiconductor substrate except for the vicinity of the PN junction.

The method for manufacturing the photoelectric conversion device of this exemplary embodiment is the same as that of the first exemplary embodiment. However, in ion implantation for forming the first accumulation region 107, the mask shown in FIG. 3B is used. That is, a part of the first accumulation region 107 is formed over the second accumulation region 108.

In this exemplary embodiment, the peak of the impurity concentration distribution formed by ion implantation for forming the second accumulation region 108 is at a position deeper than the peak of the impurity concentration distribution formed by ion implantation for forming the first accumulation region 107. When a plurality of peaks are formed by ion implantation for forming the second accumulation region 108, all of them are at positions deeper than the peak of the impurity concentration distribution formed by ion implantation for forming the first accumulation region 107.

According to such a configuration, the peaks of impurity concentration distribution do not overlap. Therefore, in the photoelectric conversion portion, the region having a high N-type impurity concentration can be reduced. Therefore, when transferring charges of the photoelectric conversion portion, a potential pocket is hardly formed. As a result, the transfer efficiency can be improved.

Fourth Exemplary Embodiment

Another exemplary embodiment will be described. This exemplary embodiment differs from the first to third exemplary embodiments in the structure of the second accumulation region. So, only the differences from the first to third exemplary embodiments will be described, and the description of the same portions as those of the first to third exemplary embodiments will be omitted.

Figure 5A:
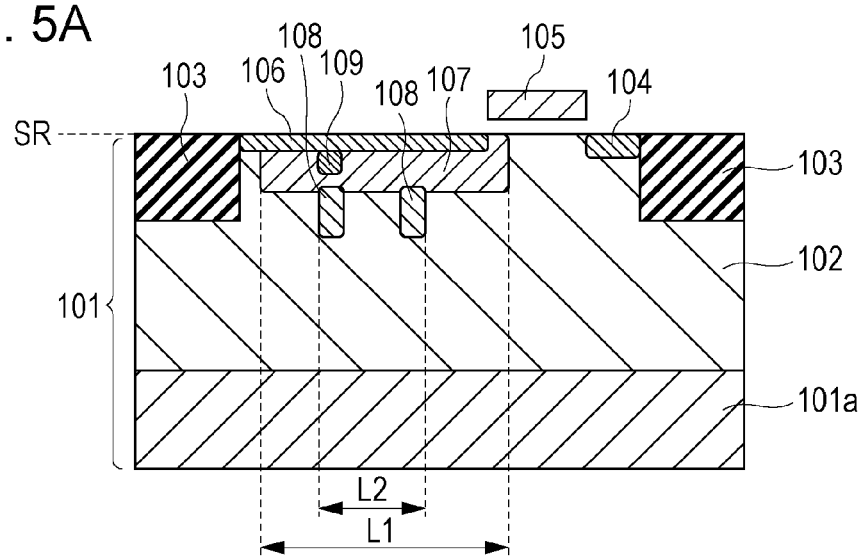
FIGS. 5A to 5D schematically show the section structure of a photoelectric conversion device, and patterns of masks used in manufacturing the photoelectric conversion device.

FIG. 5A schematically shows the section structure of a photoelectric conversion device. In this exemplary embodiment, a plurality of second accumulation regions 108 are disposed per first accumulation region 107. Each of the second accumulation regions 108 extends in the depth direction. The length L1 of the first accumulation region 107 along a first direction parallel to the surface SR of the semiconductor substrate is greater than the length L2 of the region in which the plurality of second accumulation regions 108 are disposed, along the first direction.

Figure 5B:
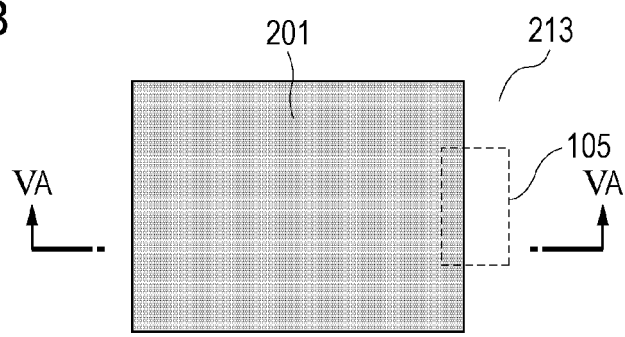
Figure 5C:
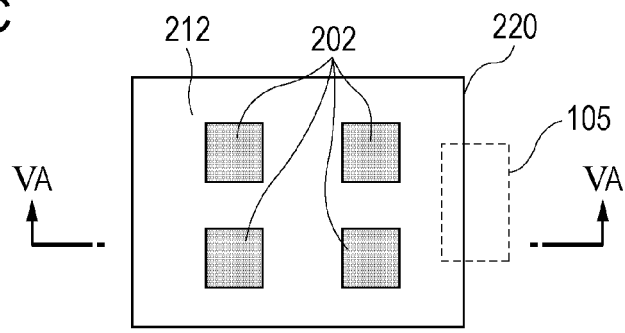

The method for manufacturing the photoelectric conversion device of this exemplary embodiment is the same as that of the second exemplary embodiment. The pattern of a first mask used in ion implantation for forming the first accumulation region 107 is schematically shown in FIG. 5B. The pattern of a second mask used in ion implantation for forming the plurality of second accumulation regions 108 is schematically shown in FIG. 5C. As shown in FIG. 5C, in this exemplary embodiment, four second accumulation regions 108 are formed. The section taken along line VA-VA of FIG. 5B, FIG. 5C corresponds to the section schematically shown in FIG. 5A.

FIG. 5C schematically shows a fourth mask used for ion implantation of the P-type impurity. However, the P-type impurity may be implanted into parts over only some of the plurality of second accumulation regions 108. Alternatively, as in the third exemplary embodiment, ion implantation of the P-type impurity may not be carried out.

According to the configuration described above, a plurality of second accumulation regions 108 are disposed. The area of PN junction of the photoelectric conversion portion can thereby be increased. Therefore, in addition to the advantageous effects of the first to third exemplary embodiments, the number of saturation charges can be increased.

The distance from the center of gravity of the orthogonal projection of the second accumulation region 108 onto a plane parallel to the surface SR of the semiconductor substrate to the orthogonal projection of the transfer gate electrode 105 onto the plane will be referred to as first distance. The distance from the center of gravity of the orthogonal projection of the first accumulation region 107 onto the plane to the orthogonal projection of the transfer gate electrode 105 onto the plane will be referred to as second distance. In this exemplary embodiment, in at least one of the plurality of second accumulation regions 108, the first distance is less than the second distance. According to such a configuration, the second accumulation region 108 is disposed near the transfer gate electrode 105, and therefore the transfer efficiency can be further improved.

Figure 5D:
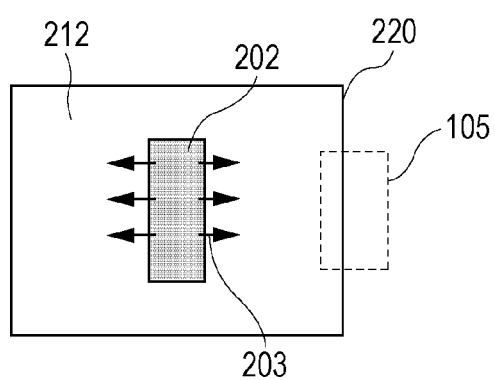

A modification of this exemplary embodiment will be described. FIG. 5D schematically shows the pattern of a second mask used in ion implantation for forming the second accumulation region 108. As shown in FIG. 5D, the opening 202 of the second mask is rectangular. The short side of the rectangle is shorter than the length of the first accumulation region 107 in a direction parallel to the short side. On the other hand, the long side of the rectangle may be longer than the length of the first accumulation region 107 in a direction parallel to the long side.

According to such a configuration, by a depletion layer extending from a well region 102 adjacent to the long side of the rectangle, the second accumulation region 108 can be depleted. Arrows 203 of FIG. 5D show the direction in which the depletion layer extends from the well region 102 adjacent to the long side of the rectangle. Therefore, the volume of the second accumulation region 108 can be increased without increasing the voltage used to deplete the second accumulation region 108. That is, the number of saturation charges can be increased while decreasing the voltage used for transfer of charges.

Fifth Exemplary Embodiment

Another exemplary embodiment will be described. This exemplary embodiment differs from the first exemplary embodiment in the positional relationship between the first accumulation region and the second accumulation region. So, only the differences from the first exemplary embodiment will be described, and the description of the same portions as those of the first exemplary embodiment will be omitted.

Figure 6A:
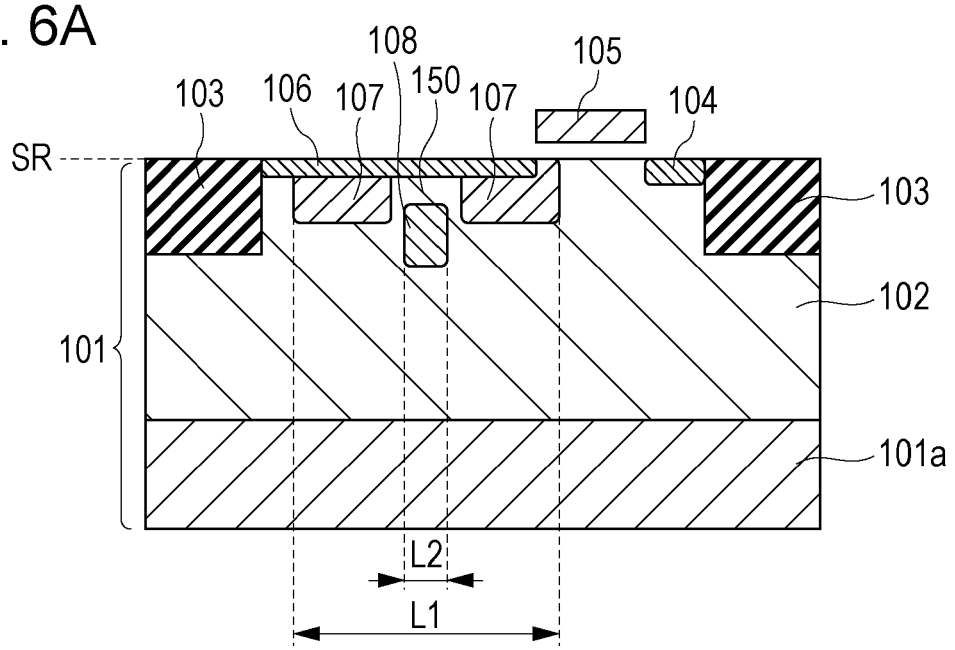
FIGS. 6A to 6C schematically show the section structure of a photoelectric conversion device, and patterns of masks used in manufacturing the photoelectric conversion device.

FIG. 6A schematically shows the section structure of a photoelectric conversion device. The same reference numerals are used to designate the same portions as those in FIG. 1A. Here, detailed description will be omitted.

The manufacturing method of this exemplary embodiment is the same as that of the first exemplary embodiment. However, a mask used in ion implantation for forming the second accumulation region 108 is different from that of the first exemplary embodiment.

Figure 6B:
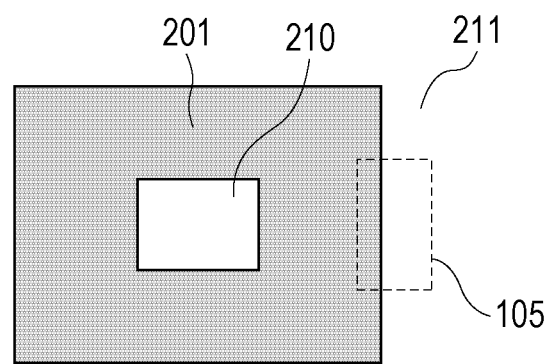

FIG. 6B schematically shows the pattern of a first mask used in ion implantation for forming the first accumulation region 107. The first mask is the same as that of the first exemplary embodiment.

Figure 6C:
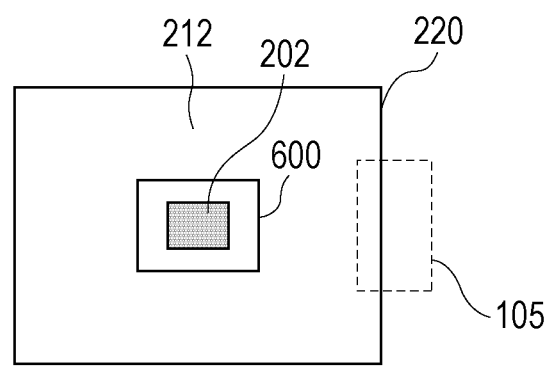

FIG. 6C schematically shows the pattern of a second mask used in ion implantation for forming the second accumulation region 108. Here, in FIG. 6C, the outer edge of the first mask portion 210 of the first mask is shown by solid line 600. As shown in FIG. 6C, the orthogonal projection of the first mask portion 210 onto a plane parallel to the surface SR of the semiconductor substrate encompasses the orthogonal projection of the opening 202 onto the plane.

In a photoelectric conversion device manufactured using such masks, the orthogonal projection of the P-type semiconductor region 150 onto a plane parallel to the surface SR of the semiconductor substrate encompasses the orthogonal projection of the second accumulation region 108 onto the plane.

According to such a configuration, the overlapping region between the first accumulation region 107 and the second accumulation region 108 can be almost eliminated. The transfer efficiency can be further improved.

The examination of the inventors shows that the potential barrier between the first accumulation region 107 and the second accumulation region 108 is sufficiently small, and therefore the electrical connection between the first accumulation region 107 and the second accumulation region 108 is maintained. For this reason, also in the structure shown in FIG. 6A, charges of the second accumulation region 108 can be transferred.

FIGS. 6B and 6C show the orthogonal projections of the patterns of masks onto a plane parallel to the surface SR of the semiconductor substrate. When designing a mask using CAD, usually, the orthogonal projection of the pattern of mask onto a plane parallel to the surface SR of the semiconductor substrate is equivalent to a CAD drawing displayed on a display or paper. Of course, a CAD drawing is a design drawing, and therefore there may be a manufacturing error between an actual pattern of mask and a CAD drawing.

Sixth Exemplary Embodiment

Another exemplary embodiment will be described. This exemplary embodiment differs from the first exemplary embodiment in the positional relationship between the first accumulation region and the second accumulation region. So, only the differences from the first exemplary embodiment will be described, and the description of the same portions as those of the first exemplary embodiment will be omitted.

Figure 7A:
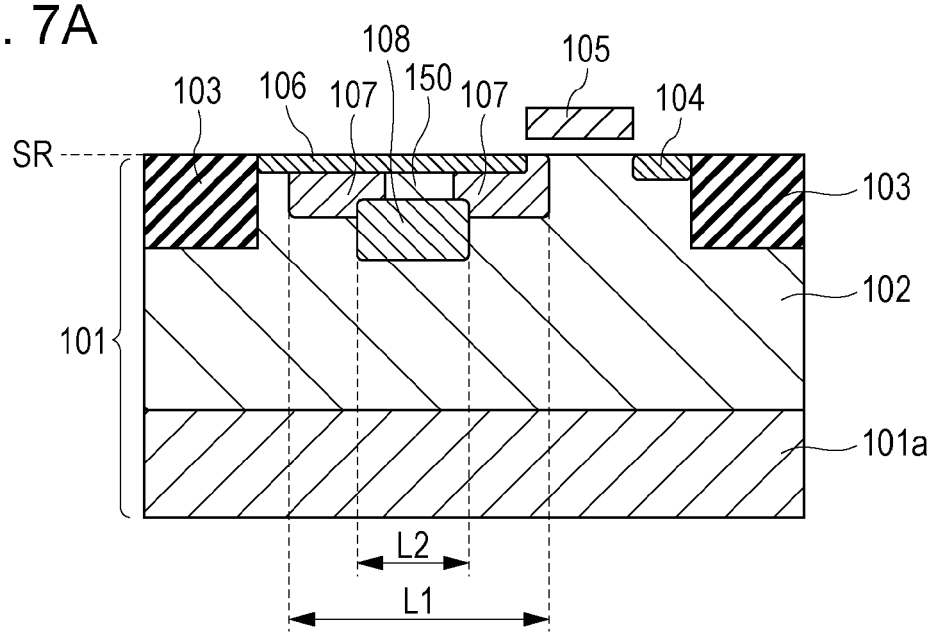
FIGS. 7A to 7C schematically show the section structure of a photoelectric conversion device, and patterns of masks used in manufacturing the photoelectric conversion device.

FIG. 7A schematically shows the section structure of a photoelectric conversion device. The same reference numerals are used to designate the same portions as those in FIG. 1A. Here, detailed description will be omitted.

The manufacturing method of this exemplary embodiment is the same as that of the first exemplary embodiment. However, a mask used in ion implantation for forming the second accumulation region 108 is different from that of the first exemplary embodiment.

Figure 7B:
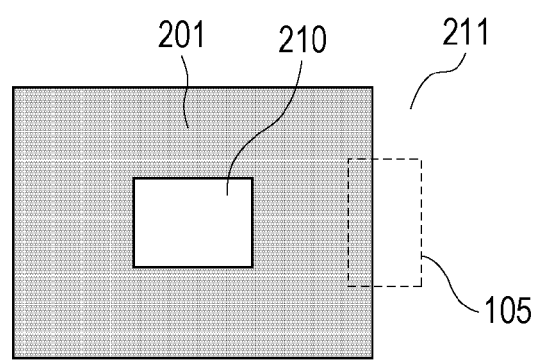

FIG. 7B schematically shows the pattern of a first mask used in ion implantation for forming the first accumulation region 107. The first mask is the same as that of the first exemplary embodiment.

Figure 7C:
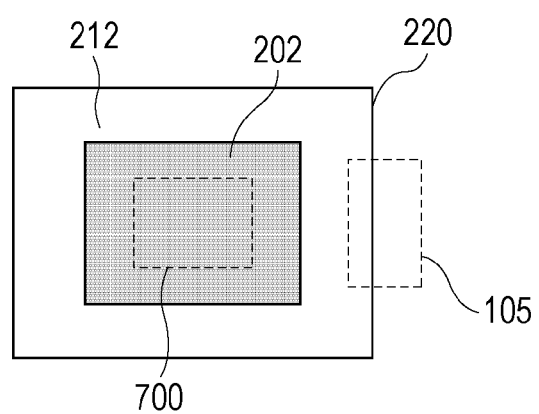

FIG. 7C schematically shows the pattern of a second mask used in ion implantation for forming the second accumulation region 108. Here, in FIG. 7C, the outer edge of the first mask portion 210 of the first mask is shown by solid line 700. As shown in FIG. 7C, the orthogonal projection of the opening 202 onto a plane parallel to the surface SR of the semiconductor substrate encompasses the orthogonal projection of the first mask portion 210 onto the plane.

In a photoelectric conversion device manufactured using such masks, the orthogonal projection of the second accumulation region 108 onto a plane parallel to the surface SR of the semiconductor substrate encompasses the orthogonal projection of the P-type semiconductor region 150 onto the plane.

According to such a configuration, even if misalignment of the mask occurs, the electrical connection between the first accumulation region 107 and the second accumulation region 108 can be sufficiently maintained. Therefore, the possibility that a potential pocket is formed by misalignment of mask can be reduced while reducing the overlapping region between the first accumulation region 107 and the second accumulation region 108.

FIGS. 7B and 7C show the orthogonal projections of the patterns of masks onto a plane parallel to the surface SR of the semiconductor substrate. When designing a mask using CAD, usually, the orthogonal projection of the pattern of mask onto a plane parallel to the surface SR of the semiconductor substrate is equivalent to a CAD drawing displayed on a display or paper. Of course, a CAD drawing is a design drawing, and therefore there may be a manufacturing error between an actual pattern of mask and a CAD drawing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-124592, filed Jun. 13, 2013, which is hereby incorporated by reference herein in its entirety.

What is claimed is:

1. A photoelectric conversion device comprising:
a semiconductor substrate;
a photoelectric conversion portion including first and second semiconductor regions of a first conductivity type disposed in the semiconductor substrate; and
a transfer portion configured to transfer charges of the first and second semiconductor regions,
wherein the first semiconductor region includes a part having a lower impurity concentration than that of a different part of the first semiconductor region,
wherein the part having the lower impurity concentration and the different part of the first semiconductor region are arranged along a first direction parallel to a surface of the semiconductor substrate,
wherein the second semiconductor region is disposed under the part having the lower impurity concentration, the second semiconductor region and the part having the lower impurity concentration being arranged along a second direction perpendicular to the surface, and
wherein a length of the first semiconductor region along the first direction is greater than a length of the second semiconductor region along the first direction, and
a semiconductor region of the second conductivity type is disposed laterally to the second semiconductor region along the first direction and under the different part of the first semiconductor region along the second direction.

2. The photoelectric conversion device according to claim 1, wherein an orthogonal projection of the part having the lower impurity concentration onto a plane parallel to the surface of the semiconductor substrate and an orthogonal projection of the second semiconductor region onto the plane coincide with each other.

3. The photoelectric conversion device according to claim 1, wherein an orthogonal projection of the part having the lower impurity concentration onto a plane parallel to the surface of the semiconductor substrate encompasses an orthogonal projection of the second semiconductor region onto the plane.

4. The photoelectric conversion device according to claim 1, wherein an orthogonal projection of the second semiconductor region onto a plane parallel to the surface of the semiconductor substrate encompasses an orthogonal projection of the part having the lower impurity concentration onto the plane.

5. The photoelectric conversion device according to claim 1,
wherein the transfer portion includes a transfer gate electrode, and
wherein a distance from a center of an orthogonal projection of the second semiconductor region onto a plane parallel to the surface of the semiconductor substrate to an orthogonal projection of the transfer gate electrode onto the plane is less than a distance from a center of an orthogonal projection of the first semiconductor region onto the plane to the orthogonal projection of the transfer gate electrode onto the plane.

6. A photoelectric conversion device comprising:
a semiconductor substrate;
a photoelectric conversion portion including first and second semiconductor regions of a first conductivity type disposed in the semiconductor substrate, the first semiconductor region including a first part and a second part different from the first part;
a transfer portion configured to transfer charges of the first and second semiconductor regions;
a third semiconductor region of a second conductivity type disposed over both of the first part and the second part of the first semiconductor region; and
a fourth semiconductor region of the second conductivity type,
wherein the first part, the fourth semiconductor region, and the second part are arranged in this order along a first direction parallel to a surface of the semiconductor substrate,
wherein the second semiconductor region is disposed under the fourth semiconductor region, the second semiconductor region and the fourth semiconductor region being arranged along a second direction perpendicular to the surface, and wherein a length of the first semiconductor region along the first direction is greater than a length of the second semiconductor region along the first direction, and a semiconductor region of the second conductivity type is disposed laterally to the second semiconductor region along the first direction and under the first part and the second part of the first semiconductor region along the second direction.

7. The photoelectric conversion device according to claim 6, wherein an orthogonal projection of the second semiconductor region onto a plane parallel to the surface of the semiconductor substrate and an orthogonal projection of the fourth semiconductor region onto the plane coincide with each other.

8. The photoelectric conversion device according to claim 6, wherein an orthogonal projection of the second semiconductor region onto a plane parallel to the surface of the semiconductor substrate encompasses an orthogonal projection of the fourth semiconductor region onto the plane.

9. The photoelectric conversion device according to claim 6, wherein an orthogonal projection of the fourth semiconductor region onto a plane parallel to the surface of the semiconductor substrate encompasses an orthogonal projection of the second semiconductor region onto the plane.

10. The photoelectric conversion device according to claim 6,
wherein the transfer portion includes a transfer gate electrode, and
wherein a distance from a center of gravity of an orthogonal projection of the second semiconductor region onto a plane parallel to the surface of the semiconductor substrate to an orthogonal projection of the transfer gate electrode onto the plane is less than a distance from a center of gravity of an orthogonal projection of the first semiconductor region onto the plane to the orthogonal projection of the transfer gate electrode onto the plane.

11. A photoelectric conversion device comprising:
a semiconductor substrate;
a photoelectric conversion portion including first and second semiconductor regions of a first conductivity type disposed in the semiconductor substrate;
a transfer portion configured to transfer charges of the first and second semiconductor regions;
a third semiconductor region of a second conductivity type disposed over the first semiconductor region; and
a fourth semiconductor region of the second conductivity type,
wherein the first semiconductor region includes a first part and a second part different from the first part,
wherein the first part, the second part, and the fourth semiconductor region are disposed at a same depth,
wherein the first part, the fourth semiconductor region, and the second part are arranged in this order along a first direction parallel to a surface of the semiconductor substrate,
wherein the second semiconductor region is disposed under the fourth semiconductor region,
wherein a length of the first semiconductor region along the first direction is greater than a length of the second semiconductor region along the first direction,
wherein the transfer portion includes a transfer gate electrode, and
wherein a distance from a center of gravity of an orthogonal projection of the second semiconductor region onto a plane parallel to the surface of the semiconductor substrate to an orthogonal projection of the transfer gate electrode onto the plane is less than a distance from a center of gravity of an orthogonal projection of the first semiconductor region onto the plane to the orthogonal projection of the transfer gate electrode onto the plane.

12. The photoelectric conversion device according to claim 11, wherein an orthogonal projection of the second semiconductor region onto a plane parallel to the surface of the semiconductor substrate and an orthogonal projection of the fourth semiconductor region onto the plane coincide with each other.

13. The photoelectric conversion device according to claim 11, wherein an orthogonal projection of the second semiconductor region onto a plane parallel to the surface of the semiconductor substrate encompasses an orthogonal projection of the fourth semiconductor region onto the plane.

14. The photoelectric conversion device according to claim 11, wherein an orthogonal projection of the fourth semiconductor region onto a plane parallel to the surface of the semiconductor substrate encompasses an orthogonal projection of the second semiconductor region onto the plane.

* * * * *